(12) United States Patent
Hayashi et al.

(10) Patent No.: US 7,989,561 B2
(45) Date of Patent: Aug. 2, 2011

(54) COMPOSITION OF LIQUID, SOLID AND SEMISOLID EPOXY RESINS

(75) Inventors: Makoto Hayashi, Saitama (JP); Koshin Nakai, Saitama (JP); Katsuto Murata, Saitama (JP)

(73) Assignee: Taiyo Holdings Co., Ltd., Tokyo (JP)

( * ) Notice: Subject to any disclaimer, the term of this patent is extended or adjusted under 35 U.S.C. 154(b) by 253 days.

(21) Appl. No.: 12/240,815

(22) Filed: Sep. 29, 2008

(65) Prior Publication Data

US 2009/0314532 A1    Dec. 24, 2009

(30) Foreign Application Priority Data

Jun. 20, 2008  (JP) .................. 2008-162215

(51) Int. Cl.
  *C08L 63/00*  (2006.01)
  *C08L 63/02*  (2006.01)
  *C08L 63/04*  (2006.01)
  *H05K 1/03*  (2006.01)

(52) U.S. Cl. .......... 525/486; 250/258; 525/56; 525/423; 525/481; 525/488; 525/524; 525/526

(58) Field of Classification Search .................. None
  See application file for complete search history.

(56) References Cited

U.S. PATENT DOCUMENTS

| | | | |
|---|---|---|---|
| 5,302,666 A | | 4/1994 | Hino et al. |
| 6,838,176 B2 * | | 1/2005 | Goto et al. .................. 428/413 |
| 2005/0008868 A1 * | | 1/2005 | Nakamura et al. ............ 428/414 |

FOREIGN PATENT DOCUMENTS

| | | | |
|---|---|---|---|
| JP | 07-304931 | | 11/1995 |
| JP | 07-304933 | | 11/1995 |
| JP | 11-87927 | | 3/1999 |
| JP | 2002-266172 A | * | 9/2002 |
| JP | 2002-307565 A | * | 10/2002 |
| JP | 2005-15727 | | 6/2005 |
| JP | 2005-350552 A | * | 12/2005 |

OTHER PUBLICATIONS

Tactix 742, Ciba Data Sheet, Mar. 1998, one page.*
Japan Epoxy Resin Co., Ltd., "Product Information", pp. 1-3 Japan, 2011.
Yuka Shell Epoxy Co., Ltd., "EPIKOTE", (Oct. 1996), pp. 1-3, Japan.

* cited by examiner

*Primary Examiner* — Robert Sellers
(74) *Attorney, Agent, or Firm* — Ditthavong Mori & Steiner, P.C.

(57) ABSTRACT

A thermosetting resin composition include a liquid epoxy resin, a solid epoxy resin, a semisolid epoxy resin, an epoxy curing agent, and a filler. The liquid epoxy resin is liquid at 20° C. and has at least two epoxy groups in a molecule. A solid epoxy resin is solid at 40° C. and has at least three epoxy groups in a molecule. A semisolid epoxy resin is solid at 20° C. and liquid at 40° C. and has at least two epoxy groups in a molecule. A ratio of mass of the liquid epoxy resin to a sum of mass of the solid epoxy resin and mass of the semisolid epoxy resin is about 1:1 to about 1:10, and a ratio of the mass of the solid epoxy resin to the mass of the semisolid epoxy resin is about 1:0.5 to about 1:2.

12 Claims, 2 Drawing Sheets

FIG. 1

BACKGROUND ART

COMPOSITION OF LIQUID, SOLID AND SEMISOLID EPOXY RESINS

CROSS-REFERENCE TO RELATED APPLICATIONS

The present application claims priority under 35 U.S.C. §119 to Japanese Patent Application No. 2008-162215, filed Jun. 20, 2008. The contents of this application are incorporated herein by reference in their entirety.

BACKGROUND OF THE INVENTION

1. Field of the Invention

The present invention relates to a thermosetting resin composition, a dry film including the thermosetting resin composition, and a multilayer printed wiring board including the thermosetting resin composition.

2. Discussion of the Background

As a process for producing a multilayer printed wiring board, a production technique of buildup method that an organic insulation layer and a conductor layer are alternately built up on the conductor layer of an inner layer circuit substrate has been paid to attention in recent years. For example, there is proposed a process for producing a multilayer printed wiring board that an epoxy resin composition is coated on a circuit-formed inner layer circuit substrate and heat cured, then a concave-convex roughened surface is formed on the surface by a roughening agent, and a conductor layer is formed by plating (see Japanese Unexamined Patent Publication 07-304931 and Japanese Unexamined Patent Publication 07-304933). Further, there is proposed a process for producing a multilayer printed wiring board that an adhesion sheet of an epoxy resin composition is laminated on a circuit-formed inner layer circuit substrate and heat cured, then a concave-convex roughened surface is formed on the surface by a roughening agent, and a conductor layer is formed by plating (see Japanese Unexamined Patent Publication 11-87927).

Figure 1:
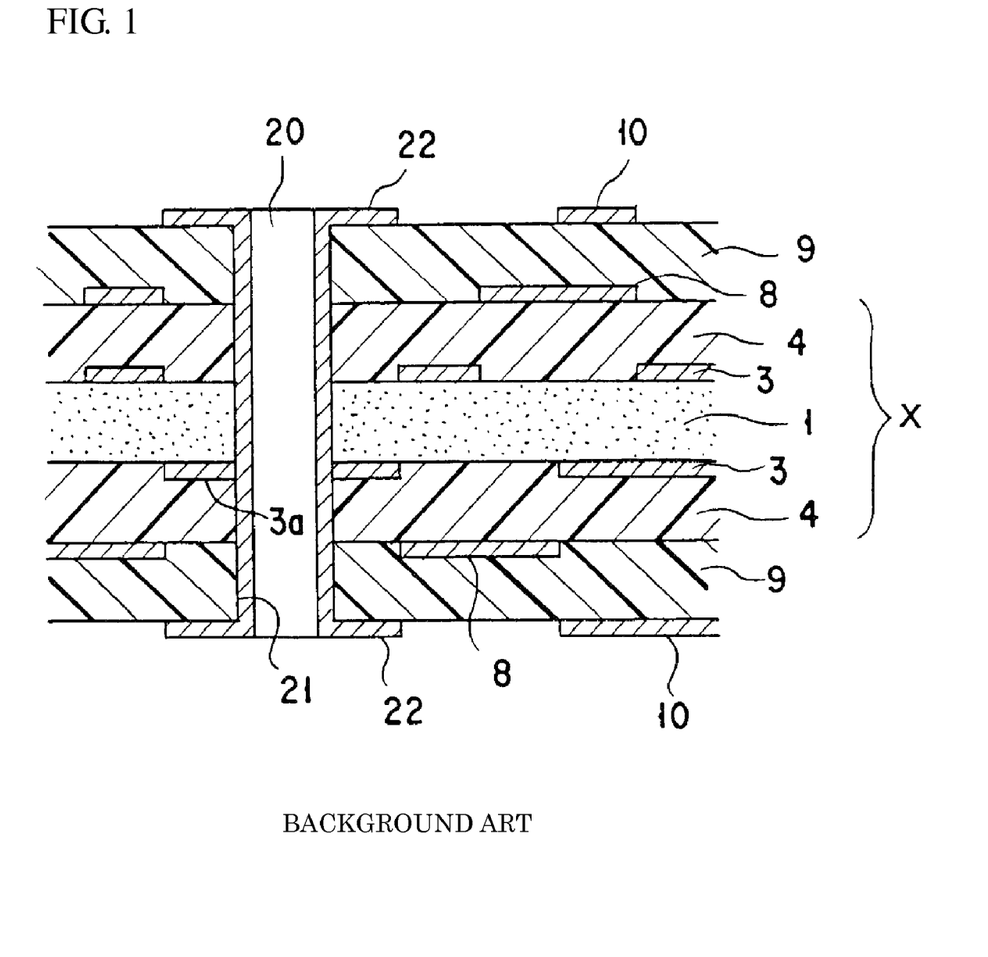
FIG. 1 is a partially sectional view showing a schematic constitution of the multilayer printed wiring board produced by a conventional buildup method.

A process for producing a multilayer printed wiring board by a conventional buildup method will be explained as an example with reference to FIG. 1; first, outer layer conductor patterns 8 are formed on both sides of a laminated substrate X that an inner layer conductor pattern 3 and a resin insulation layer 4 are previously formed on both surfaces of an insulation substrate 1, on which an epoxy resin composition is coated by a suitable method such as screen printing method, splay coating method and curtain coating method, then heat cured, thereby to form a resin insulation layer 9. (In the case of using a dry film or prepreg, it is heat cured by lamination or hot plate press to form a resin insulation layer 9.)

Subsequently, a through-hole 21 penetrating a resin insulation layer 9 and a laminated substrate X, and a via hole (not shown) for electrically connecting connection parts in each conductor layer are formed. Boring can be conducted by a suitable means such as drill, mold punch and laser light. Thereafter, roughening of each resin insulation layer 9 using a roughening agent and desmear of hole parts are conducted. In general, roughening treatment of the cured coating of an epoxy resin composition on an inner layer circuit substrate is conducted as follows; the entire surface of the cured composition is swelled with an organic solvent such as N-methyl-2-pyrrolidone, N,N-dimethylformamide and methoxypropanol, or an alkaline aqueous solution such as sodium hydroxide and potassium hydroxide, and roughened using an oxidant such as bichromate, permanganate, ozone, hydrogen peroxide/sulfuric acid and nitric acid.

Next, a conductor layer is formed on the surface of resin insulation layer 9 by nonelectrolytic plating, electrolytic plating, or a combination of nonelectrolytic plating and electrolytic plating. The process for forming a conductor layer by nonelectrolytic plating is a process where the entire surface of the cured composition is immersed in an aqueous solution containing a catalyst for plating to adsorb the catalyst, then, immersed in a plating solution to precipitate plating. The conductor layer in this case is coated not only on the surface of resin insulation layer 9 but also coated on the whole surface in the through-hole 21 and blind holes. Subsequently, in accordance with a common method (subtractive method, semi-additive method, and the like), a predetermined circuit pattern is formed in a conductor layer on the surface of resin insulation layer 9 to form an outermost layer conductor pattern 10 on both sides as shown in FIG. 1. In this case, a plating layer is also formed in the through-hole 21 as described above, as a result, a connection part 22 of outermost layer conductor pattern 10 and a connection part 3a of inner layer conductor pattern 3 of the multilayer printed wiring board are electrically connected, and a through-hole 20 is formed. Further, in the case of producing a multilayer printed wiring board, the resin insulation layer and conductor layer may alternately be built up. Additionally, in the buildup, an example of forming the resin insulation layer and conductor layer on the laminated substrate has been explained, but in place of a laminated substrate, a single-sided substrate or a double-sided substrate may be used.

As described above, as a composition used for forming an interlayer insulation layer of a multilayer printed wiring board, an epoxy resin composition is generally used. However, since cured coatings of the conventional epoxy resin composition are difficult to form a good concave-convex roughened surface by roughening treatment, there has been a problem that adhesion strength to a conductor layer is low.

Further, in accompanying with the development of miniaturization and high performance of electric appliances, buildup layers in a multilayer printed wiring board are multilayered, there have been increasing demands of a multilayer printed wiring board having a multi-via structure called a staggered via or a stacked via that a via hole is connected across a plurality of buildup insulation layers. In the multilayer printed wiring board having such multi-via structure, since coefficients of thermal expansion of copper wiring for connecting via holes and an insulation layer are markedly different, when reliability tests such as thermal cycle are carried out, there has been posed a problem that copper wiring or an insulation layer is cracked.

Then, in order to suppress the coefficient of thermal expansion of a resin composition composing an insulation layer low and to enhance peel strength (peeling strength) of a conductor layer formed by plating, there has been proposed a resin composition for interlayer insulation of a multilayer printed wiring board (see Japanese Unexamined Patent Publication No. 2005-154727) as follows: it comprises (a) an epoxy resin being liquid at a temperature of 20° C. having an epoxy group of two or more in a molecule, (b) a solid epoxy resin of aromatic series having an epoxy group of three or more in a molecule and an epoxy equivalent of 200 or less, (c) a phenol series curing agent, (d) at least one resin having a glass transition temperature of 100° C. or more selected from the group consisting of a phenoxy resin, a polyvinyl acetal resin, a polyamide resin and a polyamideimide resin, wherein the ratio of the component (a) and component (b) to the epoxy resin is 1:0.3 to 1:2 in weight ratio, the ratio of an epoxy group in the resin composition to a phenolic hydroxyl group in the phenol series curing agent of component (c) is 1:0.5 to 1:1.5, and the content of the resin of component (d) is 2 to 20% by weight of the resin composition.

As the resin composition for interlayer insulation, by containing two kinds of epoxy resins of liquid epoxy resin and solid epoxy resin and a phenoxy resin, and the like having a glass transition temperature of 100° C. or more, the coefficient of thermal expansion of the resulting thermosetting resin composition can be suppressed low. However, in a state before curing (dry coating, dry film and prepreg), although measurements by an Erichsen tester at low test speed show relatively high values, measurements show low values at high test speed because the compound ratio of a solid epoxy resin is low, so a point to be improved on handling in processing a board has been left yet.

The contents of Japanese Unexamined Patent Publication 07-304931, Japanese Unexamined Patent Publication 07-304933, Japanese Unexamined Patent Publication 11-87927, and Japanese Unexamined Patent Publication No. 2005-154727 are incorporated herein by reference in their entirety.

SUMMARY OF THE INVENTION

According to a first aspect of the present invention, a thermosetting resin composition includes a liquid epoxy resin, a solid epoxy resin, a semisolid epoxy resin, an epoxy curing agent, and a filler. The liquid epoxy resin is liquid at 20° C. and has at least two epoxy groups in a molecule. A solid epoxy resin is solid at 40° C. and has at least three epoxy groups in a molecule. A semisolid epoxy resin is solid at 20° C. and liquid at 40° C. and has at least two epoxy groups in a molecule. A ratio of mass of the liquid epoxy resin to a sum of mass of the solid epoxy resin and mass of the semisolid epoxy resin is about 1:1 to about 1:10, and a ratio of the mass of the solid epoxy resin to the mass of the semisolid epoxy resin is about 1:0.5 to about 1:2.

According to a second aspect of the present invention, a dry film includes a thin membrane of the thermosetting resin composition according to the first aspect of the invention, and a supporting base film. The thin membrane of the thermosetting resin composition is formed on the supporting base film.

According to a third aspect of the present invention, a multilayer printed wiring board includes an inner layer circuit substrate, a conductor layer, and a resin insulation layer. The conductor layer has a predetermined circuit pattern. The resin insulation layer includes a cured coating of the thermosetting resin composition according to the first aspect of the present invention. The conductor layer and the resin insulation layer are alternately provided on the inner layer circuit substrate. The resin insulation layer has a boundary face which has a microscopic concave-convex roughened surface and to which the conductor layer is bonded.

According to a fourth aspect of the present invention, a multilayer printed wiring board includes an inner layer circuit substrate, a conductor layer, and a resin insulation layer. The conductor layer has a predetermined circuit pattern. The resin insulation layer includes a dry film according to the second aspect of the invention. The conductor layer and the resin insulation layer are alternately provided on the inner layer circuit substrate. The resin insulation layer has a boundary face which has a microscopic concave-convex roughened surface and to which the conductor layer is bonded.

According to a fifth aspect of the present invention, a thermosetting resin composition includes an epoxy resin (A) being liquid at 20° C. having a plurality of epoxy groups in a molecule, an epoxy resin (B) being solid at 40° C. having at least three epoxy groups in a molecule, and an epoxy resin (C) being solid at 20° C. and liquid at 40° C. having a plurality of epoxy groups in a molecule. A ratio of mass of the epoxy resin (A) to a sum of mass of the epoxy resin (B) and mass of the epoxy resin (C) is about 1:1 to about 1:10, and a ratio of the mass of the epoxy resin (B) to the mass of the epoxy resin (C) is about 1:0.5 to about 1:2.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

The embodiments will now be described with reference to the accompanying drawings, wherein like reference numerals designate corresponding or identical elements throughout the various drawings.

In the case of containing the specific compounding ratio in a combination of (A) an epoxy resin being liquid at 20° C. having an epoxy group of two or more in a molecule, (B) a solid epoxy resin being solid at 40° C. having an epoxy group of three or more in a molecule and (C) a semisolid epoxy resin being solid at 20° C. and liquid at 40° C. having an epoxy group of two or more in a molecule, it is most suitable for an interlayer insulation layer of a multilayer printed wiring board that exhibits excellent adhesion to a base material and a conductor, the cured coatings exhibits a relatively low coefficient of thermal expansion, peel strength (peeling strength) of a conductor layer formed by plating is high, and possess both high heat resistance and roughened properties by roughening treatment. Namely, in the case of the combination of a liquid epoxy resin with a two functional group (A) and a solid epoxy resin with a three or more functional group (B), when the compounding ratio of liquid epoxy resin (A) is high, viscosity upon coating a resin composition onto a base material becomes high, and a resin soaks a lot in lamination onto a base material as a dry film. Reversely when the compounding ratio of solid epoxy resin (B) is high, a sufficient flexibility of a dry coating is not obtained, cracks and powder dropping occur in the dry coating, peeling and breakage take place in measuring adhesion strength by an Erichsen test. Further, in lamination onto a circuit substrate, there is a tendency that no sufficient flowability for a resin composition to be filled in a via hole and a through-hole is obtained. The studies of the present inventors have revealed that when in addition to the liquid epoxy resin with a two functional group (A) and solid epoxy resin with a three or more functional group (B), a semisolid epoxy resin being solid at 20° C. and liquid at 40° C. having an epoxy group of two or more in a molecule (C) is used in combination of the specific compounding ratio, there is no problem described above, the resulting thermosetting resin composition exhibits excellent adhesion to a base material and a conductor, the cured coating maintains a relatively low coefficient of thermal expansion, peel strength (peeling strength) of a conductor layer formed by plating is high, and an interlayer insulation layer with excellent insulation reliability can be formed. Further, by being mixed with a thermoplastic resin (F), detachment of fillers becomes easy in roughening treatment, a stable roughed surface can be formed, and also peel strength of a plated conductor layer is high due to the anchor effect, and a multilayer printed wiring board that an interlayer insulation layer with excellent heat resistance, electrical insulation properties and the like is formed can be produced.

By using the thermosetting resin composition according to the embodiment of the present invention or dry film thereof in a buildup method that a conductor circuit layer and an insulation layer are alternately built up, it is possible to produce a multilayer printed wiring board that peel strength of a plated conductor layer is high, no crack is generated by a reliability test such as thermal cycle, and an interlayer insulation layer with excellent heat stability and electrical insulation properties is formed.

Hereinafter, each constituent of the thermosetting rein composition according to an embodiment of the present invention will be explained in detail.

First, as an epoxy resin, as described above, it is necessary to use in combination of (A) an epoxy resin being liquid at 20° C. having an epoxy group of two or more in a molecule, (B) a solid epoxy resin being solid at 40° C. having an epoxy group of three or more in a molecule and (C) a semisolid epoxy resin being solid at 20° C. and liquid at 40° C. having an epoxy group of two or more in a molecule. Here, a determination method of "being liquid" in the present specification is explained.

Determination of liquid form is conducted in accordance with "Confirmation Method of Liquid Form" in Exhibit No. 2 of ministerial ordinance on test of dangerous substance and aspect (Ministry of Home Affairs Ordinance No. 1, 1989). The contents of the "Confirmation Method of Liquid Form" in Exhibit No. 2 are incorporated herein by reference in their entirety.

(1) Apparatus

Constant-temperature bath: one equipped with a stirrer, heater, thermometer, automatic temperature regulator (capable of temperature control in ±0.1° C.) having a depth of 150 mm or more is used.

Additionally, for all the determinations of the epoxy resins used in Examples described below, a low temperature constant-temperature bath (Yamato Scientific Co., Ltd.; BU300 type) and Thermomate, a constant-temperature apparatus of input type (BF500 type) are used in combination, about 22 liters of tap water is put in the low temperature constant-temperature bath (BU300 type), a switch of Thermomate (BF500 type) equipped thereto is turned on, which is set to a preset temperature (20° C. or 40° C.) and water temperature is finely adjusted to the preset temperature ±0.1° C. by Thermomate (BF500 type), but any apparatus capable of similar adjustment can be used.

Figure 2A:
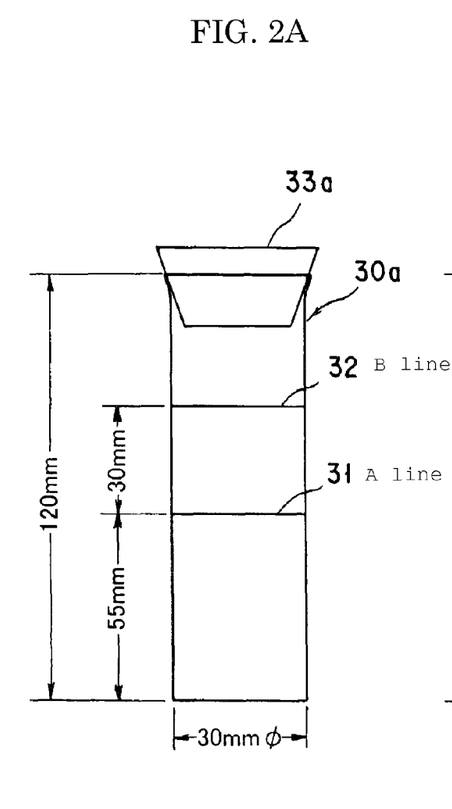
FIGS. 2A and 2B are schematic side views showing two test tubes used in determination of liquid form of an epoxy resin.
Figure 2B:
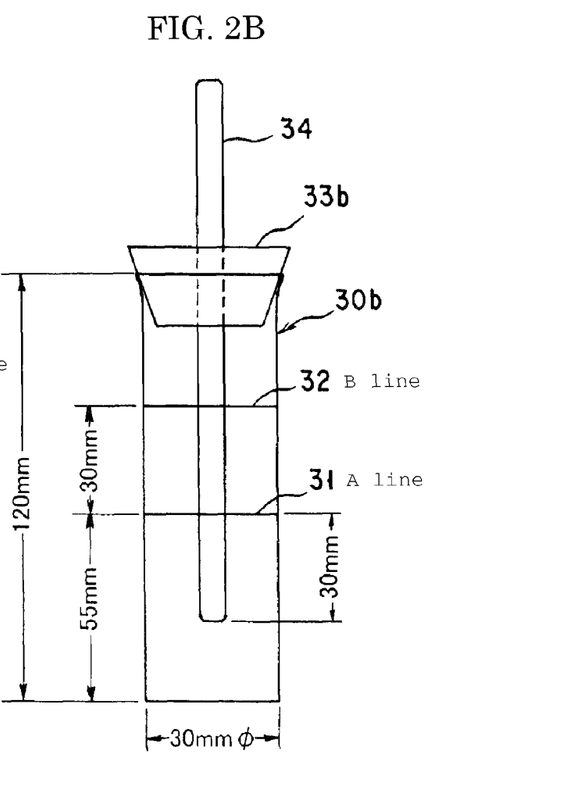

Test Tube:

As test tubes shown in FIGS. 2A and 2B, they are made of transparent glass having a flat bottom cylindrical shape of 30 mm in inner diameter and 120 mm in height where gauge lines 31, 32 are given each at heights of 55 mm and 85 mm from the bottom, a test tube for determination of liquid form 30a whose opening of a test tube is sealed with a rubber plug 33a, and a test tube for measuring temperature 30b of the same size being provided with the same gauge lines whose opening is sealed with a rubber plug 33b having a hole bored for inserting and supporting a thermometer at the center and having a thermometer 34 inserted in the rubber plug 33b are used. Hereinafter, a gauge line at a height of 55 mm from the bottom is called "A line", and a gauge line at a height of 85 mm from the bottom is called "B line."

As a thermometer 34, one for measuring a solidification point (SOP-58 scale ranges, 20 to 50° C.) specified by JIS B7410 (1982) "Thermometer made of glass for testing petrochemicals" is used, but one capable of measurement in a temperature range of 0 to 50° C. may be enough. The contents of JIS B7410 (1982) "Thermometer made of glass for testing petrochemicals" are incorporated herein by reference in their entirety.

(2) Implementation Procedure of Test

Samples left at a temperature of 20±5° C. under atmospheric pressure for more than 24 hours are put in a test tube for determination of liquid form 30a shown in FIG. 2A and a test tube for measuring temperature 30b shown in FIG. 2B each up to A line. The two test tubes 30a and 30b are erected for B line to be under the water surface in a low temperature constant-temperature bath and allowed to stand still. A thermometer is set for its bottom edge to be 30 mm under the A line.

After a sample temperature reaches a preset temperature ±0.1° C., the condition is kept as it is for 10 minutes. After 10 minutes, the test tube for determination of liquid form 30a is taken out from the low temperature constant-temperature bath, it is immediately placed horizontally on a horizontal test table, a time that a front edge of liquid level inside the test tube moves from A line to B line is measured with a stopwatch and recorded. The sample is determined at a preset temperature as liquid form when the time measured is within 90 seconds, and as solid form when the time measured exceeds 90 seconds.

As the epoxy resin being liquid at 20° C. having an epoxy group of two or more in a molecule (A), there are listed a bisphenol-A type epoxy resin, bisphenol-F type epoxy resin, phenol novolac type epoxy resin, tert-butyl-catechol type epoxy resin, glycidyl amine type epoxy resin, aminophenol type epoxy resin, alicyclic epoxy resin and the like. Additionally, it goes without saying that an epoxy resin of component (A) may be liquid at a temperature of less than 20° C. Further, the epoxy resin is preferably an aromatic epoxy resin from the viewpoint of preferable physical properties of the cured material. Additionally, in the present specification, an aromatic epoxy resin means an epoxy resin having an aromatic skeleton in a molecule. Hence, the component (A) is more preferably "an aromatic epoxy resin being liquid at 20° C. having an epoxy group of two or more in a molecule." These epoxy resins may be used alone or in combination of two kinds or more.

As the solid epoxy resin being solid at 40° C. having an epoxy group of three or more in a molecule (B), there are listed a naphthalene type epoxy resin such as EXA4700 manufactured by DIC Corporation (four functional naphthalene type epoxy resin) and NC-7000 manufactured by Nippon Kayaku Co., Ltd. (multifunctional solid epoxy resin containing naphthalene skeleton); an epoxidized product of the condensate of phenols with aromatic aldehyde containing a phenolic hydroxyl group (trisphenol type epoxy resin) such as EPPN-502H manufactured by Nippon Kayaku Co., Ltd. (trisphenol epoxy resin); a dicyclopentadiene aralkyl type epoxy resin such as Epiclon HP-7200H manufactured by DIC Corporation (multifunctional solid epoxy resin containing a dicyclopentadiene skeleton); a biphenyl aralkyl type epoxy resin such as NC-3000H manufactured by Nippon Kayaku Co., Ltd. (multifunctional solid epoxy resin containing a biphenyl skeleton); a novolac type epoxy resin such as Epiclon N660, Epiclon N690 manufactured by DIC Corporation and EOCN-104S manufactured by Nippon Kayaku Co., Ltd.; and tris(2,3-epoxypropyl)isocyanurate such as TEPIC manufactured by Nissan Chemical Industries, Ltd. These epoxy resins may be used alone, or in combination of two kinds or more thereof. In particular, to provide a low thermal expansion, an epoxy resin containing a naphthalene skeleton is preferably used.

As the semisolid epoxy resin being solid at 20° C. and liquid at 40° C. having an epoxy group of two or more in a molecule (C), there are listed a bisphenol-A type epoxy resin such as Epiclon 860, Epiclon 900-1M, Epiclon EXA-4816, Epiclon EXA-4822 manufactured by DIC Corporation, Araldite AER280 manufactured by Asahi-Ciba Co., Ltd., Epotohto YD-134 manufactured by Tohto Kasei Co., Ltd., JER834, JER872 manufactured by Japan Epoxy Resins Co., Ltd., and ELA-134 manufactured by Sumitomo Chemical Co., Ltd.; a naphthalene type epoxy resin such as Epiclon HP-4032 manufactured by DIC Corporation; and a phenol novolac type epoxy resin such as Epiclon N-740 manufactured by DIC Corporation. These epoxy resins may be used alone, or in combination of two kinds or more thereof.

In the embodiment of the present invention, it is desirable that the compounding ratio of three kinds of epoxy resins used in a composition of the (A) an epoxy resin being liquid at 20° C. having an epoxy group of two or more in a molecule, (B) solid epoxy resin being solid at 40° C. having an epoxy group of three or more in a molecule, and (C) semisolid epoxy resin being solid at 20° C. and liquid at 40° C. having an epoxy group of two or more in a molecule is (A):(B+C)=about 1:1 to 1:10, preferably about 1:2 to 1:10, and (B):(C)=about 1:0.5 to about 1:2 in mass ratio. Further, the compounding ratio of the liquid epoxy resin (A) and solid epoxy resin (B) is desirably (A):(B)=1:0.5 to 1:5 in mass ratio. When the liquid epoxy resin (A) is too high exceeding the ratio, viscosity of a resin composition becomes high, and a resin soaks a lot in lamination onto a base material as a dry film. On the other hand, when the solid epoxy resin (B) is too high exceeding the ratio, sufficient flexibility of a dry coating is not obtained, cracks and powder dropping occur in the dry coating, peeling and breakage take place in measuring adhesion strength by an Erichsen test. Further, when the semisolid epoxy resin (C) is outside the ratio, a problem resulting from use of the liquid epoxy resin groups (A) and solid epoxy resin (B) tends to arise. Additionally, since the liquid epoxy resin (A) contributes to improvement on adhesion of the cured coating obtained and the solid epoxy resin (B) contributes to an increase in glass transition point, by adjusting these ratios, the balance of the characteristics can be adjusted.

As the epoxy curing agent (D), various epoxy resin curing agents conventionally known or epoxy resin curing accelerators can be compounded. For example, there can be used a phenol resin, imidazole compound, acid anhydride, aliphatic amine, alicylic polyamine, aromatic polyamine, tertiary amine, dicyanediamide, guanidines, or epoxy adducts thereof, micro-encapsulated materials, and also organic phosphine series compounds such as triphenyl phosphine, tetraphenyl phosphonium and tetraphenyl borate, DBU or its derivatives, regardless of any curing agent or curing accelerator, well-known ones may be used alone or in combination of two kinds or more. These epoxy curing agents are preferably compounded in a range of 0.1 to 50 parts by mass relative to the total amount of 100 parts by mass of the epoxy resins (A) to (C). When the compounding amount is less than the range, curing becomes insufficient, whereas even when a large amount exceeding the range is compounded, no accelerating effect on curing is increased, so it is not preferable because a problem that heat resistance and mechanical strength deteriorate tends to arise.

Among the epoxy curing agents, a phenol resin and an imidazole compound are preferable. As the phenol resin, there can be used well-known ones such as a phenol novolac resin, alkyl phenol novolac resin, bisphenol-A novolac resin, dicyclopentadiene type phenol resin, Xylok type phenol resin, terpene-modified phenol resin and polyvinyl phenols, alone or in combination of two kinds or more thereof.

Further, an imidazole compound is preferable from the points that reaction is mild in a temperature region (80° C. to 130° C.) in drying solvents in a composition and reaction can be sufficiently carried out in a temperature region (150° C. to 200° C.) in curing, and physical properties of the cured material can be sufficiently exhibited. The imidazole compound is also preferable from the point that it is excellent in adhesion to a copper circuit and copper foil. As a specific example of particularly preferable ones, there are listed 2-ethyl-4-methylimidazole, 2-methylimidazole, 2-phenylimidazole, 2-phenyl-4-methylimidazole, bis(2-ethyl-4-methyl-imidazole), 2-phenyl-4-methyl-5-hydroxymethylimidazole, 2-phenyl-4,5-dihydroxymethylimidazole, triazine-added type imidazole and the like, they can be used alone or in combination of two kinds or more thereof.

Next, as the filler (E), all inorganic fillers and organic fillers conventionally known can be used, it is not particularly limited, but since operation for forming a minute concave-convex roughened surface on the surface of a cured coating by roughening treatment is mainly resulted from that a roughening agent penetrates into a boundary face between a cured coating and a filler, and fillers on the surface of the cured coating drops out, so that an inorganic filler having excellent affinity with a roughening agent is preferable. As an inorganic filler, there are listed, for example, body pigments such as barium sulfate, barium titanate, amorphous silica, crystalline silica, molten silica, spherical silica, talc, clay, magnesium carbonate, calcium carbonate, aluminum oxide, aluminum hydroxide, silicon nitride and aluminum nitride, and metal powders such as copper, tin, zinc, nickel, silver, palladium, aluminum, iron, cobalt, gold and platinum. These inorganic fillers suppress shrinkage in curing of coatings, and contribute to improvement of characteristics such as adhesion and hardness in addition to an operation for forming a minute concave-convex roughened surface by roughening treatment. Among these inorganic fillers, silica and barium sulfate that are hardly damaged by a roughening agent are preferable, in particular, spherical silica is preferable from the point that it can be compounded in a high ratio in a composition. The average particle diameter of a filler is preferably 3 μm or less, and further preferably 1 μm or less.

The compounding amount of filler (E) is 40 to 200 parts by mass relative to the total amount of 100 parts by mass of the epoxy resins (A) to (C), preferably, the ratio is suitably 50 to 150 parts by mass. When the compounding amount of the filler is less than the range, it becomes difficult to form an excellent minute concave-convex roughened surface, on the other hand, when exceeding the range, it is not preferable because flowability of a composition becomes bad.

The thermosetting composition according to the embodiment of the present invention can further contains, for improving mechanical strength of the cured coating obtained, a thermoplastic resin (F) whose glass transition temperature is 100° C. or more, for example, a thermoplastic polyhydroxypolyether resin described below, a phenoxy resin being the condensate of epichlorohydrine with various kinds of two-functional phenol compounds, or a phenoxy resin that a hydroxyl group of hydroxyether part present in the skeleton is esterified using various acid anhydrides or acid chlorides, polyvinyl acetal resin, polyamide resin, polyamideimide resin and the like, which are used alone or in combination of two kinds or more thereof. When the glass transition temperature of thermoplastic resin (F) is less than 100° C., the mechanical strength of the cured material is not sufficient, and inorganic fillers tend to precipitate on the surface of the cured material after roughening, so it becomes difficult to obtain a sufficient peel strength of a plated conductor layer. The glass transition temperature is determined according to a method described in JIS (Japanese Industrial Standards) K7197. The contents of JIS K7197 are incorporated herein by reference in their entirety. Additionally, even in the case where no glass transition temperature is actually observed because the glass transition temperature is higher than decomposition temperature, it is included in the definition of "glass transition temperature is 100° C. or more" in the embodiment of the present invention. Additionally, the decomposition temperature is defined as a temperature when a mass decreasing rate is 5% in measurement according to a method described in JIS K7120. The contents of JIS K7120 are incorporated herein by reference in their entirety.

As a specific example of phenoxy resins, there are listed FX280, FX293 manufactured by Tohto Kasei Co., Ltd., YX8100, YL6954, YL6974 manufactured by Japan Epoxy Resins Co., Ltd., and the like. As a specific example of polyvinyl acetal resins, S-LEC KS-series manufactured by Sekisui Chemical Co., Ltd. are listed, as an polyamide resin, KS 5000 series manufactured by Hitachi Chemical Co., Ltd. and BP series manufactured by Nippon Kayaku Co., Ltd. are listed, further, as an polyamideimide resin, KS 9000 series manufactured by Hitachi Chemical Co., Ltd. are listed.

Among the thermoplastic resins, a thermoplastic polyhydroxypolyether resin having a fluorene skeleton is preferable. Since the thermoplastic polyhydroxypolyether resin has a high glass transition point because of having a fluorene skeleton and is excellent in heat resistance, as well as it maintains a low coefficient of thermal expansion due to epoxy resins (A) to (C), it maintains its glass transition point, the resulting cured coating has a good balance of both low coefficient of thermal expansion and high glass transition point. Further, since a thermoplastic polyhydroxypolyether resin has a hydroxyl group, it shows excellent adhesion to a base material and a conductor, as well as the cured coating obtained is hardly damaged by a roughening agent, but a roughening agent in a form of aqueous solution is easy to penetrate into the boundary face between the cured coating and filler, fillers on the surface of the cured coating tend to drop out by roughening treatment, resulting in easily forming an excellent roughened surface.

As the thermoplastic polyhydroxypolyether resin having a fluorene skeleton, for example, a thermoplastic polyhydroxypolyether resin expressed by the following general formula (1) can be appropriately used.

[STR1]

(1)

In the above general formula (1), X represents the following general formula (2) or (3), the ratio of the general formula (3) relative to the total X in the general formula (1) is 8% or more, Z is a hydrogen atom or a glycidyl group, and n is an integer of 21 or more.

[STR2]

(2)

In the above general formula (2), $R^1$ and $R^2$ are selected from a hydrogen atom, an alkyl group having carbon numbers of 1 to 5, and a halogen atom, Y is any one of $—SO_2—$, $—CH_2—$, $—C(CH_3)_2—$ or $—O—$, and m is 0 or 1. $R^1$ and $R^2$ may be the same or different.

[STR3]

(3)

The molecular weight of the thermoplastic polyhydroxypolyether resin having a fluorene skeleton is preferably in a range of 5,000 to 100,000 (weight average molecular weight measured by gel permeation chromatography (GPS) in terms of standard polystyrene). When the molecular weight is less than 5,000, thermoplasticity is lost, whereas when it exceeds 100,000, solution viscosity when it is dissolved in a solvent is too high, it is not preferable because it becomes difficult to add a lot of fillers.

A halogen may be introduced in the thermoplastic polyhydroxypolyether resin having a fluorene skeleton for providing flame resistance. In the case of providing flame resistance with a halogen, when the content of halogen is less than 5% by mass, it is difficult to provide a sufficient flame resistance, on the other hand, no further improvement is observed even when the concentration is more than 40% by mass, so it is practical that the content of halogen is controlled in a range of 5 to 40% by mass. The kind of halogen may be any one, but from the viewpoint of commercial production, it is preferable to utilize a commercially available bromide compound, chloride compound or fluorine compound.

As a process for producing the thermoplastic polyhydroxypolyether resin having a fluorene skeleton, a method of direct reaction of divalent phenols with epichlorohydrine, and a method of addition polymerization reaction of diglycidyl ether of divalent phenols with divalent phenols are known, and either production method may be adopted for the resin. Additionally, regarding a process for producing the thermoplastic polyhydroxypolyether resin, it is described in detail in Japanese Unexamined Patent Publication 11-269264 as a reference.

The compounding amount of the thermoplastic resin (F) in the thermosetting resin composition according to the embodiment of the present invention is preferably 5 to 50 parts by mass relative to the total amount of 100 parts by mass of the epoxy resins (A) to (C), and preferably 10 to 40 parts by mass. When the compounding amount of the thermoplastic resin (F) is outside the range, it becomes difficult to obtain a uniform roughened surface condition.

Further, in the thermosetting resin composition according to the embodiment of the present invention, a polyimide resin, polyphenol resin, polyisocyanate resin, polyester resin, thermosetting type polyphenylene ether resin and the like may be added.

Further, the thermosetting resin composition according to the embodiment of the present invention can contain an organic solvent as needed. As an organic solvent, there can be used ordinary solvents, for example, ketones such as acetone, methyl ethyl ketone and cyclohexanone; ester acetates such as ethyl acetate, butyl acetate, cellosolve acetate, propylene glycol monomethyl ether acetate and carbitol acetate; cellosolves such as cellosolve and butyl cellosolve; carbitols such as carbitol and butyl carbitol; aromatic hydrocarbons such as toluene and xylene; dimethylformamide, dimethylacetamide and the like, alone or in combination of two kinds or more thereof.

The thermosetting resin composition according to the embodiment of the present invention can further use, according to need, well-known coloring agents such as phthalocyanine blue, phthalocyanine green, iodine green, disazo yellow, crystal violet, titanium oxide, carbon black and naphthalene black; well-known thickener such as asbestos, olben, benton and finely-divided silica; defoaming agents and/or leveling agents of such as silicone series, fluorine series and polymer series; adhesion providing agents such as thiazole series, triazole series, silane coupling agent; and well-known additives of such as titanate series and aluminum series.

Although the thermosetting resin composition according to the embodiment of the present invention makes the formation of roughened surface easy by containing fillers (E), deterioration of surface smoothness and the like occurs easily. Regarding this point, the embodiment of the present invention can prevent deterioration of surface smoothness by compounding a defoaming agent and/or leveling agent (G) particularly among the additives, and also prevent deterioration of interlayer insulation due to voids and pinholes.

As a specific example of the defoaming agent and/or leveling agent (G), as a commercially available defoaming agent composed of non-silicone series foam-breaking polymer solution, BYK (trademark)-054, -055, -057, -1790, and the like manufactured by Big Chemie Japan Co., Ltd. are listed, and as a silicone series defoaming agent, BYK (trademark)-063,-065, -066N, -067A, -077 manufactured by Big Chemie Japan Co., Ltd. and KS-66 (product name), and the like manufactured by Shin-Etsu Chemical Co., Ltd. are listed.

The compounding amount of such defoaming agent and/or leveling agent (G) is 5 parts by weight or less relative to total amount of 100 parts by mass of the epoxy resins (A) to (C) and thermoplastic resin (F), preferably, 0.01 to 5 parts by weight is suitable.

The mode of the thermosetting resin composition according to the embodiment of the present invention may be provided as a coating material whose viscosity is suitably adjusted, or as a dry film that a thermosetting resin composition is coated on a supporting base film and a solvent is dried. It may further be provided as a prepreg sheet that the composition is coated on and/or immersed in a fibrous base material of sheet form such as glass cross, glass, and aramid nonwoven and half cured. As the supporting base film, there are listed polyolefin such as polyethylene and polyvinyl chloride, polyesters such as polyethylene terephthalate, polycarbonate, polyimide, further, exfoliate paper, metal foils such as copper foil and aluminum foil. Additionally, the supporting base film may be subjected to mad treatment, corona treatment or the like.

A coating material, dry film or prepreg using the thermosetting resin composition may be directly coated on an inner layer circuit substrate that a circuit was formed, then dried and cured, or it may be heat-laminated with a dry film and formed integrally, thereafter cured in an oven, or cured by a hot plate press. In the case of prepreg, it is layered on an inner layer circuit substrate, sandwiched by metal plates via a release film, pressured and heated to be subjected to pressing.

Among the processes, a method of lamination or hot plate press is preferable because a minute concavity and convexity by an inner circuit is eliminated in heat melting, cured as it is to finally give a multilayer substrate of flat surface condition. Further, when a base material that an inner layer circuit was formed and a film or prepreg of the thermosetting resin composition according to the embodiment of the present invention are laminated or hot plate pressed, a copper foil or a base material that a circuit was formed can be laminated at the same time.

The substrate thus obtained is bored by a semiconductor laser such as $CO_2$ laser and UV-YAG laser, or by drill. The hole may be either a through-hole aiming at conducting the front and back of the substrate, or a partial hole (conformal via) aiming at conducting a circuit of an inner layer and a circuit on the surface of an interlayer insulation layer.

After boring, to remove residue (smear) present in the inner wall and bottom of a hole and to exhibit an anchor effect on a conductor layer (metal plating formed thereafter), for forming a minute concave-convex roughened surface on the surface, it is carried out with a commercially available desmear liquid (roughening agent) or a roughening agent containing an oxidant such as permanganate, bichromate, ozone, hydrogen peroxide/sulfuric acid, and nitric acid at the same time.

Next, after forming a hole that residue was removed by a desmear liquid and a coating surface that a minute concave-convex roughened surface was generated, a circuit is formed by a subtractive method, semi-additive method or the like. In any method, after carrying out nonelectrolytic plating or electrolytic plating, or both plating, for removing stress of metal and improving strength, heat treatment called anneal may be carried out at about 80 to 180° C. for 10 to 60 minutes.

The metal plating used here is not particularly limited, and copper, tin, solder, nickel and the like, or in combination of a plurality thereof can be used. Further, plating used here can be replaced by sputtering of metal, and the like.

EXAMPLES

Hereinafter, Examples, Comparative example and Test example of the present invention will be explained, but the present invention is not limited to the following Examples. Additionally, hereinafter, "part" and "%" are all based on mass unless otherwise specified.

Examples 1 to 6 and Comparative Examples 1 to 3

Each component was compounded according to a formulation shown in Table 1 below, kneaded and dispersed by a three-roll mill to obtain a thermosetting resin composition that viscosity was adjusted to 20 dPa·s ±10 dPa·s (rotational viscometer 5rpm, 25° C.).

TABLE 1

| Composition (part by mass) | | Example | | | | | | Comparative example | | |
|---|---|---|---|---|---|---|---|---|---|---|
| | | 1 | 2 | 3 | 4 | 5 | 6 | 1 | 2 | 3 |
| Liquid epoxy resin (A) | Epicoat 807*[1] | 10 | 5 | 10 | 15 | 20 | 10 | 10 | 5 | 30 |
| Solid epoxy resin (B) | Epiclon N-690*[2] | 20 | | | 15 | | | 20 | | 6 |
| | Epiclon N-660*[3] | | 25 | 25 | | 10 | 20 | | 5 | |
| Semisolid epoxy resin (C) | Epiclon 860*[4] | 20 | | | 15 | 10 | 20 | | | |
| | Epiclon N-740*[5] | | 25 | 25 | | | | | 30 | 4 |
| Phenol series curing agent | LA-7052-60M*[6] | 25 | | | | | | 25 | | |
| | HF1M*[7] | | 20 | 20 | 20 | 20 | 20 | | 20 | 20 |
| Imidazole series curing agent | Curezole 2PHZ*[8] | | 5 | 5 | 5 | 5 | 3 | | | |
| Thermoplastic resin | FX293AM40*[9] | 8 | 10 | 15 | 10 | 20 | 20 | 8 | 10 | 15 |
| Inorganic filler | SO-C2*[10] | 60 | 100 | 100 | 100 | 100 | 100 | 60 | 100 | 100 |
| Organic solvent | Cyclohexanone | 20 | 30 | 30 | 30 | 30 | 30 | 20 | 30 | 30 |
| | Methyl ethyl ketone | 20 | 30 | 30 | 30 | 30 | 30 | 20 | 30 | 30 |
| A:B | | 1:2 | 1:5 | 1:2.5 | 1:1 | 1:0.5 | 1:2 | 1:2 | 1:1 | 1:0.2 |
| B:C | | 1:1 | 1:1 | 1:1 | 1:1 | 1:1 | 1:1 | — | 1:6 | 1:0.66 |
| A:(B + C) | | 1:4 | 1:10 | 1:5 | 1:2 | 1:1 | 1:4 | 1:2 | 1:7 | 1:0.33 |
| Adhesion strength | | ○ | ○ | ○ | ○ | ○ | ○ | X | ○ | ○ |
| Soaking | | ○ | ○ | ○ | ○ | ○ | ○ | ○ | X | X |

Remarks
*[1]Bisphenol-A type liquid epoxy resin manufactured by DIC Corp.
*[2]Solid novolac type epoxy resin manufactured by DIC Corp.
*[3]Solid novolac type epoxy resin manufactured by DIC Corp.
*[4]Semisolid bisphenol-A type epoxy resin manufactured by DIC Corp.
*[5]Semisolid phenol novolac type epoxy resin manufactured by DIC Corp.
*[6]MEK vanish of Phenolite LA-7052-60M manufactured by DIC Corp., phenol novolac resin containing triazine structure (solid content 60%)
*[7]Novolac phenol resin manufactured by Meiwa Plastic Industries Ltd.
*[8]Imidazole derivative manufactured by Shikoku Chemicals Corp.
*[9]Thermoplastic polyhydroxypolyether resin having fluorene skeleton manufactured by Tohto Kasei Corp.
*[10]Spherical silica manufactured by Admatec GmbH.

Production of Adhesion Film

The thermosetting resin compositions thus obtained were each coated on a PET film (Toray Industries Inc., Luminar 38R75: 38 μm) using a bar coater for the membrane thickness of film to be 63 μm after drying, and dried at 110° C. for 15 minutes, thereby to obtain an adhesion film.

Test Example:

The adhesion film was heat-laminated on a buffed-finish copper plate of 0.8 mm thickness using a vacuum laminator (MEIKI Corporation, MVLP-500) under the conditions of 5 kgf/cm$^2$, 120° C., 1 minute and 1 Torr, subsequently, leveled by a hot plate press under the conditions of 10 kgf/cm$^2$, 130° C. and 1 minute, then cured in a hot air circulating type dryer under the condition of 150° C.×30 minutes.

The sample obtained was measured for adhesion strength, and determined on the basis of the following standard. Further, the sample obtained was observed for soaking of resin, and determined on the basis of the following standard. The results are shown in Table 1 all together Adhesion Strength In a test carried out using an Erichsen tester (Erichsen AG, type 202-C) at a test speed of 7 m/min, when the extrusion length of an extrusion pin when detachment or crack occurs is 3 mm or less, it was denoted as x, and when exceeding 3 mm, it was denoted as o.

Soaking of Resin

When soaking was less than 5 mm, it was denoted as o, and when 5 mm or more, it was denoted as x.

As is clear from the results shown in the above Table 1, in each Example using the thermosetting resin composition according to the embodiment of the present invention, there was no soaking of resin, and high adhesion strength was shown. In contrast, in Comparative example 1 where a thermosetting resin composition not containing a semisolid epoxy resin was used, adhesion strength was inferior. Further, in Comparative example 2 and in Comparative example 3, although there was no serious problem in adhesion strength because the composition contains a semisolid epoxy resin, soaking of resin took places because the compounding ratio of liquid epoxy resin was high.

The thermosetting resin composition according to the embodiment of the present invention exhibits excellent adhesion to a base material and a conductor, the cured coatings exhibits a relatively low coefficient of thermal expansion, and also peel strength (peeling strength) of a conductor layer formed by plating is high, and possess both high heat resistance and roughened properties by roughening treatment, so that it is useful for forming an interlayer insulation layer of a multilayer printed wiring board by a buildup method where a conductor circuit layer and an insulation layer are alternately built up, and also useful for producing a dry film or prepreg for an interlayer insulating material.

Obviously, numerous modifications and variations of the present invention are possible in light of the above teachings. It is therefore to be understood that within the scope of the appended claims, the invention may be practiced otherwise than as specifically described herein.

What is claimed is:

1. A thermosetting resin composition comprising:
   a liquid epoxy resin being liquid at 20° C. and having at least two epoxy groups in a molecule;
   a solid epoxy resin being solid at 40° C. and having at least three epoxy groups in a molecule;
   a semisolid epoxy resin being solid at 20° C. and liquid at 40° C. and having at least two epoxy groups in a molecule;

an epoxy curing agent; and a filler, wherein a ratio of mass of the liquid epoxy resin to a sum of mass of the solid epoxy resin and mass of the semisolid epoxy resin is about 1:1 to about 1:10, and wherein a ratio of the mass of the solid epoxy resin to the mass of the semisolid epoxy resin is about 1:0.5 to about 1:2.

2. The thermosetting resin composition according to claim 1, wherein a ratio of the mass of the liquid epoxy resin to the mass of the solid epoxy resin is about 1: 0.5 to about 1:5.

3. The thermosetting resin composition according to claim 1, further comprising:

a thermoplastic resin with a glass transition temperature of at least about 100° C.

4. The thermosetting resin composition according to claim 3, wherein the thermoplastic resin comprises a thermoplastic polyhydroxypolyether resin having a fluorene skeleton.

5. A dry film wherein a thin membrane of the thermosetting resin composition according to claim 1 is formed on a supporting base film.

6. A multilayer printed wiring board comprising:

an inner layer circuit substrate;

a conductor layer having a predetermined circuit pattern; and a resin insulation layer comprising a cured coating of the thermosetting resin composition according to claim 1, the conductor layer and the resin insulation layer being alternately provided on the inner layer circuit substrate, the resin insulation layer having a boundary face which has a microscopic concave-convex roughened surface and to which the conductor layer is bonded.

7. A multilayer printed wiring board comprising:

an inner layer circuit substrate;

a conductor layer having a predetermined circuit pattern; and a resin insulation layer comprising a dry film according to claim 5, the conductor layer and the resin insulation layer being alternately provided on the inner layer circuit substrate, the resin insulation layer having a boundary face which has a microscopic concave-convex roughened surface and to which the conductor layer is bonded.

8. A thermosetting resin composition comprising:

an epoxy resin (A) being liquid at 20° C. having a plurality of epoxy groups in a molecule;

an epoxy resin (B) being solid at 40° C. having at least three epoxy groups in a molecule; and an epoxy resin (C) being solid at 20° C. and liquid at 40° C. having a plurality of epoxy groups in a molecule, wherein a ratio of mass of the epoxy resin (A) to a sum of mass of the epoxy resin (B) and mass of the epoxy resin (C) is about 1:1 to about 1:10, and wherein a ratio of the mass of the epoxy resin (B) to the mass of the epoxy resin (C) is about 1:0.5 to about 1:2.

9. The thermosetting resin composition according to claim 8, further comprising:

a thermoplastic polyhydroxypolyether resin having a fluorene skeleton with a glass transition temperature of at least about 100° C.

10. The thermosetting resin composition according to claim 8, further comprising:

a curing agent.

11. The thermosetting resin composition according to claim 8, further comprising:

a filler.

12. The thermosetting resin composition according to claim 1, wherein the ratio of the mass of the liquid epoxy resin to the sum of the mass of the solid epoxy resin and the mass of the semisolid epoxy resin is about 1:2 to about 1:10.

* * * * *